United States Patent [19]

McMann, Jr.

[11] 4,398,061

[45] Aug. 9, 1983

[54] AUDIO PROCESSING APPARATUS AND METHOD

[75] Inventor: Renville H. McMann, Jr., New Canaan, Conn.

[73] Assignee: Thomson-CSF Broadcast, Inc., Stamford, Conn.

[21] Appl. No.: 304,839

[22] Filed: Sep. 22, 1981

[51] Int. Cl.³ .......................................... H04B 15/00
[52] U.S. Cl. .............................. 179/1 VL; 179/1 P; 333/14; 333/17 L
[58] Field of Search ................... 179/1 VL, 1 P, 1 J; 333/14, 17 L; 455/240, 242

[56] References Cited

U.S. PATENT DOCUMENTS 4,071,695 1/1978 Flanagan et al. ............... 179/1 VL

Primary Examiner—G. Z. Rubinson
Assistant Examiner—James L. Dwyer
Attorney, Agent, or Firm—Martin Novack

[57] ABSTRACT

The disclosure is directed to an apparatus and method for processing an input electronic audio signal to relatively attenuate portions thereof to prevent those portions from exceeding a predetermined threshold, while minimizing adverse effects, such as unnecessary attenuation, on other portions of the signal. A zero-crossing detector detects when the input signal crosses a predetermined zero reference level. A peak detector detects the peak of the input signal during a time interval defined by successive zero-crossings. An amplitude control signal is generated as a function of the detected peak. A delay circuit receives the input signal and generates a time delayed version of the input signal. Preferably, the delay circuit has a characteristic delay time that is of the order of the longest period of audio signal to be processed. Amplitude control means, responsive to the time delayed version of the input signal and also to the amplitude control signal, are provided for applying amplitude control during said time interval as it occurs in the time delayed version of the input signal.

31 Claims, 5 Drawing Figures

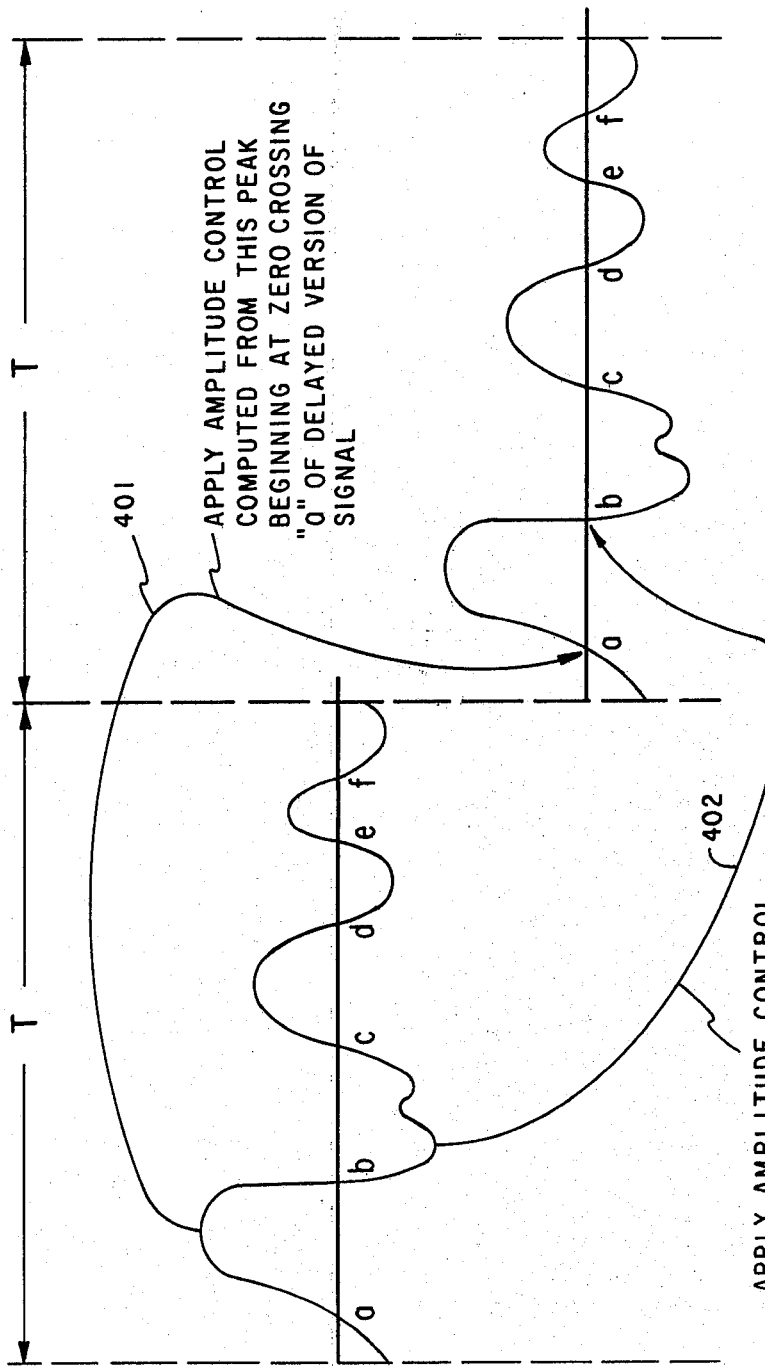

AUDIO PROCESSING APPARATUS AND METHOD

BACKGROUND OF THE INVENTION

This invention relates to the processing of audio signals and, more particularly, to an apparatus and method for dynamically adjusting the amplitude of an audio signal.

It is well known that when a portion of an electronic audio signal received by a circuit or system momentarily exceeds the amplitude processing capability of the circuit or system, the result will be a distortion of the sound in the ultimately reproduced audio. Typically, when the audio signal is amplified, portions thereof which exceed the amplitude range of the amplifier will be clipped, and the consequence is an undersirable distortion.

A number of techniques are conventionally employed for adjusting the average amplitude or the peak amplitude of a received audio signal to prevent clipping or other distortions. Unfortunately, these schemes can themselves introduce distortion or other effects which are undesirable. As a simplified example, if a substantial duration of a signal is attenuated in order to prevent one brief peak thereof from exceeding a certain limit, the result may be an undesirable decrease in the signal-to-noise ratio of the signal.

It is an object of the present invention to set forth a technique for dynamically controlling the amplitude of an audio signal to prevent the peaks of the signal from exceeding predetermined limits while minimizing the distorting or undesirable effects of the amplitude control.

SUMMARY OF THE INVENTION

The present invention is directed to an apparatus and method for processing an input electronic audio signal and, particularly, to process said signal to relatively attenuate portions thereof to prevent those portions from exceeding a predetermined threshold, while minimizing adverse effects (such as unnecessary attenuation) on other portions of the signal.

In accordance with an embodiment of the apparatus of the invention, there is provided a zero-crossing detector means for detecting when the input signal crosses a predetermined zero reference level. In the present embodiment, the zero-crossing detector is operative to detect excursions through zero in either direction. Peak detection means are provided for detecting the peak of said input signal during a time interval defined by successive zero-crossings. Means responsive to the detected peak during said interval are provided for generating an amplitude control signal as a function of the detected peak. A delay means receives the input signal and generates a time delayed version of the input signal. Preferably, the delay means has a characteristic delay time that is of the order of the longest period of audio signal to be processed. Amplitude control means, responsive to the time delayed version of the input signal and also to the amplitude control signal, are provided for applying amplitude control during said time interval as it occurs in the time delayed version of the input signal. The amplitude controlled time delayed version of the input signal is the desired processed output signal.

In the preferred embodiment of the invention, the control signal causes attenuation to be applied, and it is applied only when the detected peak exceeded a predetermined threshold. In this manner, the processed output signal includes attenuation of only those signal portions which require attenuation, and there is no unnecessary attenuation of other signal portions.

Also, in the preferred embodiment means are provided for storing all of the zero-crossings and associated peaks which occur during each characteristic delay time of the delay means. In this embodiment the zero-crossings and peaks are stored in a recirculating memory, and the addresses of the memory are addressed once every characteristic delay time. Each address corresponds to the time of a possible zero-crossing. The detected peak signal for each successive pair of zero-crossings is stored at the address corresponding to the first of said successive pair of zero crossings.

Further features and advantages of the invention will become more readily apparent from the following detailed description when taken in conjunction with the accompanying drawings.

BRIEF DESCRIPTION OF THE DRAWINGS

FIG. 4, including graphs 4A and 4B, illustrates a signal and a delayed version thereof, and is useful in understanding operation of the invention.

DESCRIPTION OF THE PREFERRED EMBODIMENT

Figure 1A:
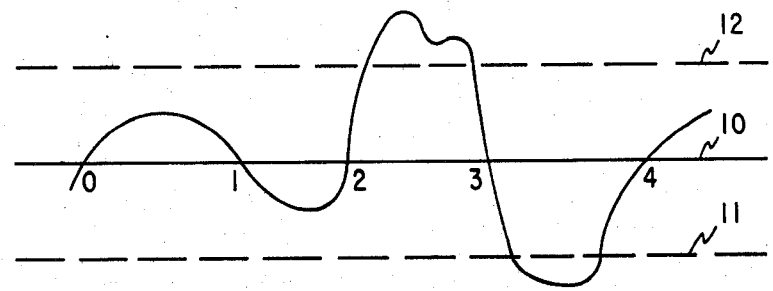
FIG. 1, including graphs 1A, 1B and 1C, shown waveforms that are useful in illustrating the type of processing achieved with the invention and a type of problem that is present in the prior art.
Figure 1B:
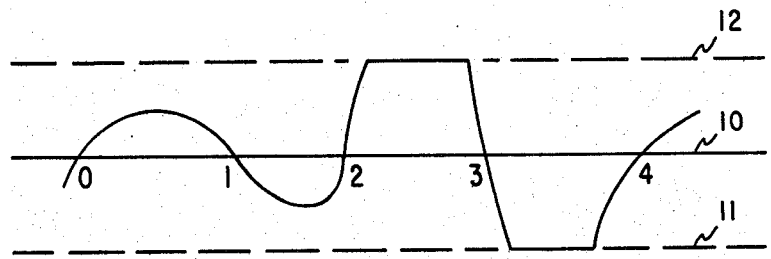

FIG. 1A illustrates a waveform or signal having characteristics of the type that may be encountered in an audio signal to be processed. The solid horizontal line 10 is the zero reference, and 0, 1, 2, 3 and 4 represent zero-crossings of the signal. If the signal of FIG. 1A is processed through a circuit or system having an amplitude processing range indicated by dashed lines 11 and 12, the result will be as shown in FIG. 2B; i.e., with clipping of the positive-going and negative-going signal portions having amplitudes that exceed the range limits 11 and 12.

Figure 1C:
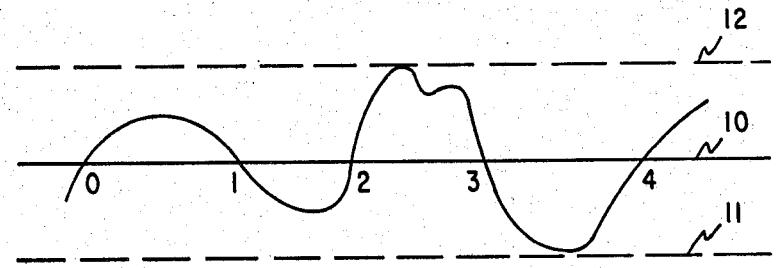

FIG. 1C illustrates the type of signal obtained after employing the present invention, assuming that the processing threshold levels of the invention correspond to the range limits 11 and 12. After processing with the present invention it is seen that only those signal portions (between successive zero-crossings) that exceed the range 11, 12 are attenuated.

Figure 2:
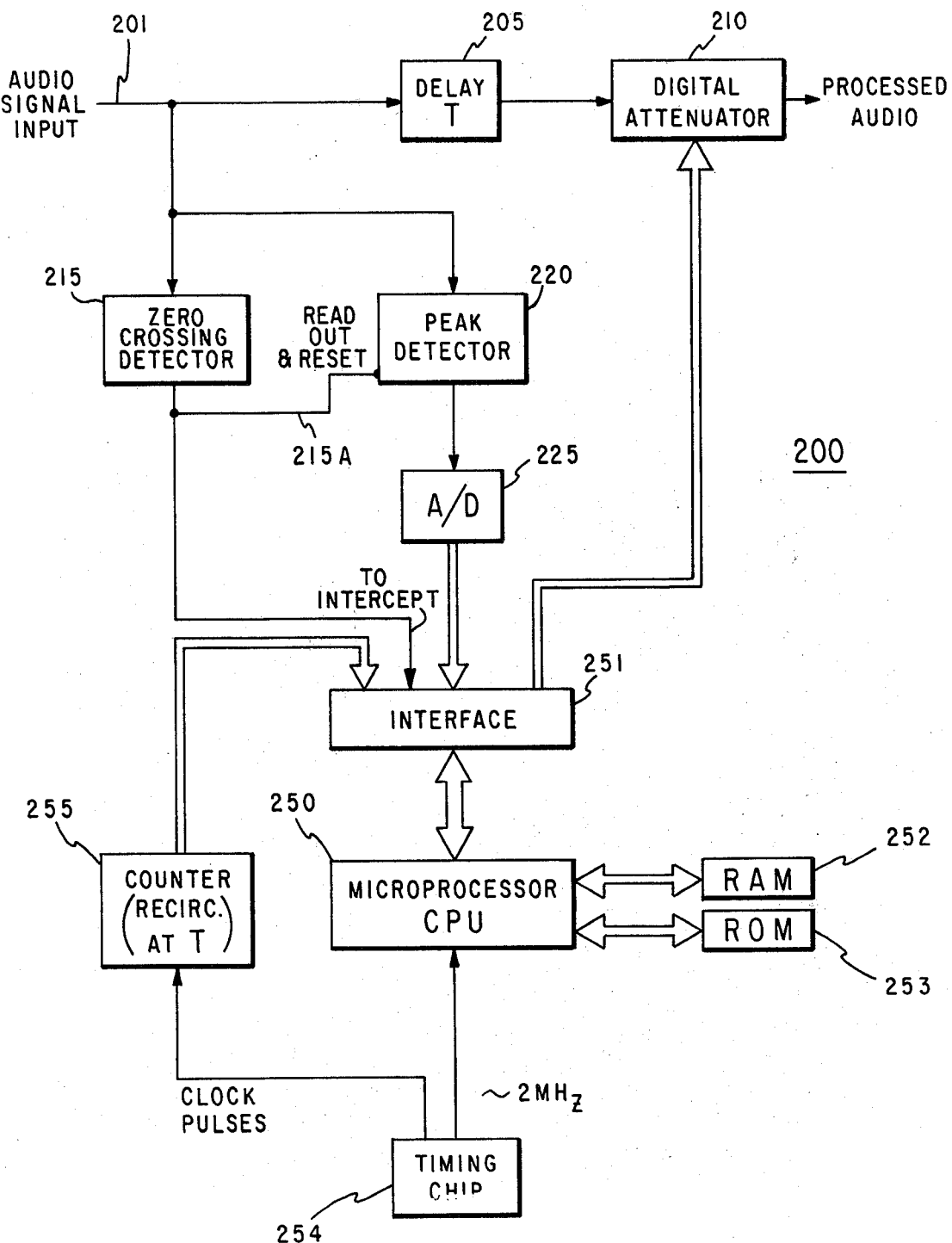
FIG. 2 is a block diagram of an apparatus in accordance with an embodiment of the invention and which can be used to practice the method of the invention.

Referring to FIG. 2, there is shown a block diagram of an apparatus 200 in accordance with the invention and which can be used to practice the method of the invention. An input electronic audio signal to be processed is received on a line 201 and is coupled to a delay circuit 205 which has a characteristic delay time T. The output of delay circuit 205 is coupled to a digital attenuator 210, whose output, in the present embodiment, is the processed audio output. The input audio signal is also coupled to a zero-crossing detector 215 and to a peak detector 220. The output of the zero-crossing detector 215 is used as an enable signal (line 215A) to enable readout of the stored peak by peak detector 220 and is also effective to reset the peak detector 220 to begin looking for a new peak. The output of zero-crossing detector 215 is also coupled, via standard interface 251, to the "interrupt" input of microprocessor 250. The output of peak detector 220 is coupled to an analog-to-digital converter 225, whose output is, in turn, coupled to microprocessor 250 via input gates of interface 251. An output of microprocessor 250 controls the digital attenuator 210, via output latches of interface 251. The microprocessor system setup conventionally includes the microprocessor central processing unit 250 and interface 251 (already referred to), a random access memory ("RAM") 252, a read-only memory ("ROM") 253, which contains the program for the microprocessor system, and a timing chip 254. The microprocessor central processing unit may be of any suitable type, for example, a model Z-80 manufactured by Zilog Corporation. It will be understood that other general purpose or special purpose processing equipment or circuitry could alternately be employed to implement the described functions. A counter 255 is provided and receives clock pulses from the timing chip 254, which also conventionally provides clock pulses to the microprocessor central processing unit. The counter 255 is operative to count the basic system clock pulses, and to cycle with a characteristic cycle time of T. The output of clock 255 is coupled to the processor 250 via input gates of interface 251.

Operation of the embodiment of FIG. 2 can be initially understood with the aid of FIG. 4. FIG. 4A shows a duration T of the audio signal input 201, and FIG. 4B shows the delayed version of the same signal; i.e., the output of delay 205 which is delayed by the characteristic delay time T. The zero-crossings of the signal are identified by the letters a through f. In operation of the system, the peak detected during a time interval between a pair of zero-crossings determines the amplitude control signal that is later applied to the same time interval as it occurs in the delayed version of the signal. For example, as indicated by the arrow 401, the peak detected between zero-crossings a and b is determinative of the amplitude control applied to the delayed version of the input signal beginning at zero-crossing a. Similarly, the peak detected between zero-crossings b and c is determinative of the amplitude control applied to the delayed version of the input signal beginning at zero-crossing b (arrow 402).

The zero-crossings of the input signal are detected by zero-crossing detector 215. Each time a zero-crossing is detected, the previous peak is read out (line 215A) of peak detector 220 to the microporcessor system via the analog-to-digital converter 225. Also, the peak detector is reset (line 215A) at each zero-crossing to begin looking for the next peak.

A portion of the random accesss memory 252 of the microprocessor system is used as a "recirculating" memory which stores the zero-crossing information and detected peak information for a period of time T corresponding to the characteristic delay time T of delay circuit 205. As previously noted, the counter 255 continuously counts basic clock pulses and recycles each time period T. Each output count is used as an address of the "recirculating" memory. As will be described in further detail hereinbelow, each time a zero-crossing occurs, an interrupt routine causes the current count and the current peak to be read by the microprocessor. The peak is then stored at the address (i.e., count) corresponding to the previous zero-crossing. (A "previous zero-crossing register" is used to remember the count (address) of the previously occuring zero-crossing. The information is then used a time T later during the next cycle through the recirculating memory. In terms of the diagram of FIG. 4, this is equivalent to the peak between zero-crossings a and b of FIG. 4A being stored at a "zero-crossing a" reference location for later use in determination of the amplitude control that is applied beginning at zero-crossing a of the delayed version of the signal (FIG. 4B), as indicated by the arrow 401. During the main loop of the routine to be described, the counts (addresses) of counter 255 are used to circulate through the memory, and each memory address is interrogated to determine the presence of a potential zero-crossing (i.e., actually a zero-crossing which was detected and stored one time period T before). When a zero-crossing is observed (as determined by the presence of a stored peak at the address corresponding to the zero-crossing), the stored peak is used to compute the appropriate amplitude control, which is then applied to digital attenuator 210. The particular count (address) which was just interrogated is then cleared (i.e., all zeros are entered at the address), and the main loop continues by interrogating the next address.

Figure 5:
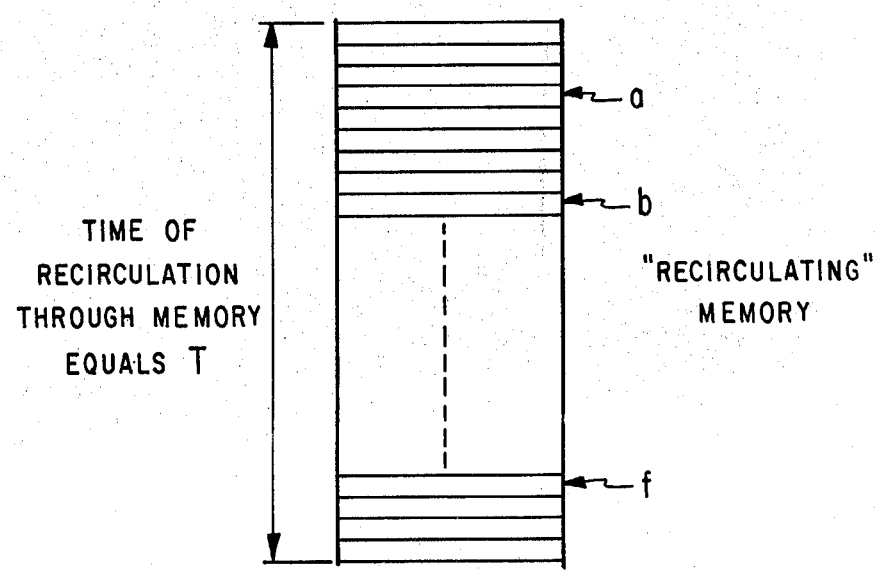
FIG. 5 illustrates a portion of the memory that is used in a "recirculating" fashion in the preferred embodiment of the invention.
Figure 3:
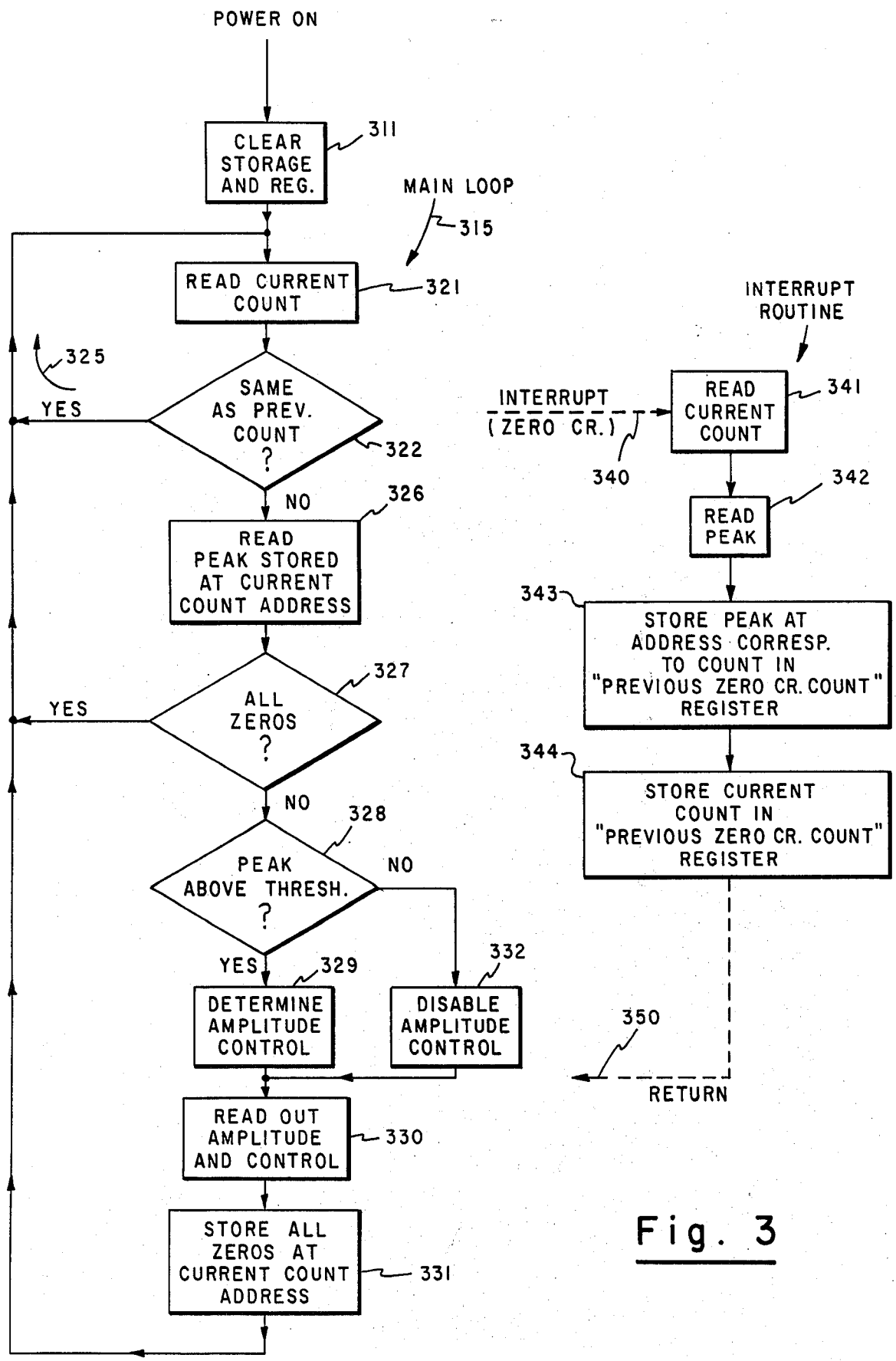
FIG. 3 is a flow diagram for the programming of the processor of FIG. 2 in accordance with an embodiment of the invention.

Referring to FIG. 3, there is shown a flow diagram suitable for programming the microprocessor 250 to operate in the system of FIG. 2 in accordance with the principles of the invention. A block 311 is initially entered, this block representing the clearing of RAM storage and registers. The main loop 315 of the routine is then entered. In the loop 315, the block 321 represents the reading of the current count (of counter 255-FIG. 2). A determination is then made (decision diamond 322) as to whether or not the count just read is the same as the previously read count. If so, block 321 is reentered and the small loop 325 continues until the inquiry of diamond 322 is answered in the negative, whereupon block 326 is entered. Block 326 represents the reading of the peak stored at the address (of the "recirculating" memory—FIG. 5) defined by the current count. If the peak read at the address is all zeros, decision diamond 327 causes block 321 to be reentered. If not, inquiry is made as to whether or not the peak read is below a predetermined threshold (diamond 328). If not, the amplitude control signal is disabled (block 332). If, however, the peak read is above the predetermined threshold, block 329 is entered. This block represents the computation of the amplitude control to be applied via digital attenuator 210 (FIG. 2). The level of amplitude control associated with each range increment of peak level (for example, an attenuation level proportional to the amount by which the peak exceeds a predetermined threshold) can be stored in a table look-up, for example, a part of the read-only memory 253 (FIG. 2). The determined amplitude control is read out to digital attenuator 210 (FIG. 2) via output latches of interface 251, as represented by the block 330. All zeros are then stored at the current count address, as represented by the block 331, and the block 321 is then reentered.

Exit from the main routine occurs, via the microprocessor "interrupt" mechanism, whenever the zero-crossing detector 215 (FIG. 2) indicates that a zero-crossing has occurred. This will cause the interrupt routine, shown on the right in FIG. 3, to be entered (arrow 340). In the interrupt routine, the current count is initially read (block 341) and the latest peak of the audio signal is read from the output of analog-to-digital converter 255 (FIG. 2), as represented by the block 342. The peak which is read is then stored (block 343) at an address which is the address of the previous zero-crossing, so that when said address is reached during the cycling through by the main program, an appropriate amplitude control can be applied (if necessary) to the proper signal portion. The count corresponding to the previous zero-crossing is "remembered" by always storing the count at the time of an interrupt in a "previous zero-crossing count" register (block 344). Return to the main routine (i.e., to the place in said routine where the interrupt occurred, is then effected. Summarizing the operation of the functions represented by the blocks 343 and 344, the peak of the latest signal interval (i.e., the interval between the last two zero-crossings) is stored at an address corresponding to the count of the previous zero-crossing (block 343), this address (count) having been remembered by virtue of its storage in a "previous zero-crossing count" register. The count corresponding to the time of the zero-crossing that just occurred then replaces the count in the "previous zero-crossing count" register, so that it is "remembered" for use when the next interrupt occurs.

Referring again to the main routine of FIG. 2, it is now seen that when the counter recirculates and again reaches a count (address) at which a zero-crossing had occurred, the amplitude of the peak which followed that zero-crossing is read (block 326) and determination is made as to whether or not the peak is above threshold. If so, an appropriate amplitude control can be applied, as represented by the blocks 329, 330 of the main routine. If not, the attenuator 210 can be set to provide no attenuation (block 332) or, if desired, a computed attenuation.

The invention has been described with reference to a particular preferred embodiment, but variations within the spirit and scope of the invention will occur to those skilled in the art. For example, the function of the counter in FIG. 2 could be implemented by the microprocessor itself. Also, it will be understood that, if desired, synchronism can be provided between the counter and the delay circuit. Finally, it will be understood that the stored peak information can be used in any desired manner to generate control signals, regardless of threshold requirements.

What is claimed is:

1. Apparatus for processing an input electronic audio signal, comprising:
   zero-crossing detector means for detecting when said input signal crosses a predetermined zero reference level;
   peak detector means for detecting the peak of said input signal during a time interval defined by successive zero crossings;
   means responsive to the detected peak of said input signal during said interval for generating an amplitude control signal as a function of said peak;
   delay means responsive to said input signal for generating a time delayed version of said input signal;
   amplitude control means responsive to the time delayed version of said input signal and to said amplitude control signal for applying amplitude control to said time delayed version of said input signal during said time interval as it occurs in the time delayed version of said input signal.

2. Apparatus as defined by claim 1 wherein said means for generating an amplitude control signal is operative to apply attenuation as a function of the degree by which said detected peak exceeds a predetermined threshold.

3. Apparatus as defined by claim 1 wherein said time delayed version of said input signal is delayed with respect to said input signal by a time that is of the order of the period of the lowest frequency input signal to be processed.

4. Apparatus as defined by claim 2 wherein said time delayed version of said input signal is delayed with respect to said input signal by a time that is of the order of the period of the lowest frequency input signal to be processed.

5. Apparatus as defined by claim 1 further comprising means for storing all indications of zero-crossings and associated peaks which occur during each characteristic delay time of said delay means.

6. Apparatus as defined by claim 2 further comprising means for storing all indications zero-crossings and associated peaks which occur during each characteristic delay time of said delay means.

7. Apparatus as defined by claim 3 further comprising means for storing all indications of zero-crossings and associated peaks which occur during each characteristic delay time of said delay means.

8. Apparatus as defined by claim 4 further comprising means for storing all indication of zero-crossings and associated peaks which occur during each characteristic delay time of said delay means.

9. Apparatus as defined by claim 5 wherein said means for storing said indications of zero-crossings and peaks comprises a recirculating memory wherein the addresses of said memory are addressed once every characteristic delay time, and wherein each address corresponds to the time of a possible zero-crossing; and wherein the detected peak signal for each successive pair of zero-crossings is stored at the address corresponding to the first of said successive pair of zero crossings.

10. Apparatus as defined by claim 6 wherein said means for storing said indications of zero-crossings and peaks comprises a recirculating memory wherein the addresses of said memory are addressed once every characteristic delay time, and wherein each address corresponds to the time of a possible zero-crossing; and wherein the detected peak signal for each successive pair of zero-crossings is stored at the address corresponding to the first of said successive pair of zero crossings.

11. Apparatus as defined by claim 7 wherein said means for storing said indications of zero-crossings and peaks comprises a recirculating memory wherein the addresses of said memory are addressed once every characteristic delay time, and wherein each address corresponds to the time of a possible zero-crossing; and wherein the detected peak signal for each successive pair of zero-crossings is stored at the address corresponding to the first of said successive pair of zero crossings.

12. Apparatus as defined by claim 8 wherein said means for storing said indications of zero-crossings and peaks comprises a recirculating memory wherein the addresses of said memory are addressed once every characteristic delay time, and wherein each address corresponds to the time of a possible zero-crossing; and wherein the detected peak signal for each successive pair of zero-crossings is stored at the address corresponding to the first of said successive pair of zero crossings.

13. Apparatus as defined by claim 9 wherein said means for generating said amplitude control signal includes means for sequencing through said recirculating memory and reading out the stored peaks associated with successive zero crossings, and means for producing said amplitude control signal in response to the read out stored peak.

14. Apparatus as defined by claim 10 wherein said means for generating said amplitude control signal includes means for sequencing through said recirculating memory and reading out the stored peaks associated with successive zero crossings, and means for producing said amplitude control signal in response to the read out stored peak.

15. Apparatus as defined by claim 11 wherein said means for generating said amplitude control signal includes means for sequencing through said recirculating memory and reading out the stored peaks associated with successive zero crossings, and means for producing said amplitude control signal in response to the read out stored peak.

16. Apparatus as defined by claim 12 wherein said means for generating said amplitude control signal includes means for sequencing through said recirculating memory and reading out the stored peaks associated with successive zero crossings, and means for producing said amplitude control signal in response to the read out stored peak.

17. Apparatus as defined by claim 5 wherein said detected peaks are stored only when they exceed a predetermined threshold.

18. Apparatus as defined by claim 9 wherein said detected peaks are stored only when they exceed a predetermined threshold.

19. Apparatus as defined by claim 13 wherein said detected peaks are stored only when they exceed a predetermined threshold.

20. Apparatus as defined by claim 16 wherein said detected peaks are stored only when they exceed a predetermined threshold.

21. A method for processing an input electronic audio signal, comprising the steps of:
    detecting when said input signal crosses a predetermined zero reference level;
    detecting the peak of said input signal during a time interval defined by successive zero crossings;
    generating an amplitude control signal as a function of said peak;
    generating a time delayed version of said input signal;
    controlling, with said amplitude control signal, the amplitude of said time delayed version of said input signal during said time interval as it occurs in the time delayed version of said input signal.

22. The method as defined by claim 21 wherein said amplitude control step is operative to apply attenuation as a function of the degree by which said detected peak exceeds a predetermined threshold.

23. The method as defined by claim 21 wherein said time delayed version of said input signal is delayed with respect to said input signal by a time that is of the order of the period of the lowest frequency input signal to be processed.

24. The method as defined by claim 22 wherein said time delayed version of said input signal is delayed with respect to said input signal by a time that is of the order of the period of the lowest frequency input signal to be processed.

25. The method as defined by claim 21 further comprising the steps of storing all indications of zero-crossings and associated peaks which occur during each characteristic delay time of said delay means.

26. The method as defined by claim 22 further comprising the steps of storing indications all of zero-crossings and associated peaks which occur during each characteristic delay time of said delay means.

27. The method as defined by claim 23 further comprising the steps of storing indications all of zero-crossings and associated peaks which occur during each characteristic delay time of said delay means.

28. The method as defined by claim 24 further comprising the steps of storing indications all of zero-crossings and associated peaks which occur during each characteristic delay time of said delay means.

29. The method as defined by claim 21 wherein said amplitude control is applied only when said peak exceeds a predetermined threshold.

30. The method as defined by claim 22 wherein said amplitude control is applied only when said peak exceeds a predetermined threshold.

31. The method as defined by claim 23 wherein said amplitude control is applied only when said peak exceeds a predetermined threshold.

* * * * *